(12) United States Patent
Sun et al.

(10) Patent No.: US 7,572,645 B2
(45) Date of Patent: Aug. 11, 2009

(54) MAGNETIC TUNNEL JUNCTION STRUCTURE AND METHOD

(75) Inventors: Jijun Sun, Chandler, AZ (US); Renu W. Dave, Chandler, AZ (US); Jason A. Janesky, Gilbert, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 85 days.

(21) Appl. No.: 11/601,129

(22) Filed: Nov. 15, 2006

(65) Prior Publication Data
US 2008/0113220 A1 May 15, 2008

(51) Int. Cl.
*H01L 29/76* (2006.01)

(52) U.S. Cl. .................. 438/3; 257/295; 257/E29.167; 365/173

(58) Field of Classification Search .................. 257/295, 257/E29.167; 438/3; 365/173; 428/811.1
See application file for complete search history.

(56) References Cited

U.S. PATENT DOCUMENTS

| | | | | |
|---|---|---|---|---|
| 5,966,323 A | * | 10/1999 | Chen et al. | 365/158 |
| 6,114,719 A | * | 9/2000 | Dill et al. | 257/295 |
| 6,127,045 A | * | 10/2000 | Gill | 428/611 |
| 6,600,184 B1 | * | 7/2003 | Gill | 257/295 |
| 6,665,155 B2 | | 12/2003 | Gill | |
| 6,674,617 B2 | * | 1/2004 | Gill | 360/324.12 |
| 6,946,697 B2 | | 9/2005 | Pietambaram | |
| 2006/0093862 A1 | * | 5/2006 | Parkin | 428/811.1 |
| 2006/0152681 A1 | | 7/2006 | Yamakawa et al. | |

OTHER PUBLICATIONS

International Search Report and Written Opinion.

* cited by examiner

*Primary Examiner*—Douglas M Menz
*Assistant Examiner*—Steven J Fulk
(74) *Attorney, Agent, or Firm*—Ingrassia Fisher & Lorenz, P.C.

(57) ABSTRACT

Methods and apparatus are provided for magnetic tunnel junctions (MTJs) (10, 50) employing synthetic antiferromagnet (SAF) free layers (14, 14'). The MTJ (10, 50) comprises a pinned ferromagnetic (FM) layer (32, 18), the SAF (14) and a tunneling barrier (16) therebetween. The SAF (14) has a first higher spin polarization FM layer (30) proximate the tunneling barrier (16) and a second FM layer (26) desirably separated from the first FM layer (30) by a coupling layer (28), with magnetostriction adapted to compensate the magnetostriction of the first FM layer (30). Such compensation reduces the net magnetostriction of the SAF (14) to near zero even with high spin polarization proximate the tunneling barrier (16). Higher magnetoresistance ratios (MRs) are obtained without adverse affect on other MTJ (10, 50) properties. NiFe combinations are desirable for the first (30) and second (26) free FM layers, with more Fe in the first (30) free layer and less Fe in the second (26) free layer. CoFeB and NiFeCo are also useful in the free layers.

20 Claims, 4 Drawing Sheets

US 7,572,645 B2

MAGNETIC TUNNEL JUNCTION STRUCTURE AND METHOD

TECHNICAL FIELD

The present invention generally relates to electronic devices, and more particularly to electronic devices employing magnetic tunnel junctions (MTJs) that use synthetic antiferromagnet (SAF) structures for the free layer.

BACKGROUND

Magnetoresistive random access memories (MRAMs) and other magneto-electronic devices that utilize magnetic tunnel junctions (MTJs) are known to have many benefits such as being fast, non-volatile, and capable of high density. MTJs comprise two ferromagnetic (FM) layers separated by a thin tunneling dielectric. Generally one ferromagnetic (FM) layer has its magnetization direction pinned or fixed, that is, unable to rotate under the operating magnetic fields, and another ferromagnetic (FM) layer has its magnetization direction free, that is, able to rotate under the operating magnetic field, provided for example, by associated write lines or other inputs. The electrical properties of the MTJ change depending upon the relative angle of the magnetization directions of the fixed and free FM layers due to the spin-dependent nature of electrons tunneling through the dielectric barrier. For example, the parallel state typically has lower resistance, while the anti-parallel state has higher resistance. The magnetoresistance ratio (MR) of a MTJ is the ratio of the change in MTJ resistance of the two logic states (e.g., the parallel and anti-parallel states), to that of the low resistance state.

It is known that there can be advantages in replacing one or both of the ferromagnetic (FM) layers of the MTJ with synthetic antiferromagnet (SAF) layered structures, where two ferromagnetic layers are antiferromagnetically coupled through a nonmagnetic coupling layer. However, it has been found that, despite the other benefits that may be obtained, using a SAF free layer, especially in toggle MRAM structures, can reduce the magnetoresistance ratio (MR) of the MTJ and/or interfere with other properties of the magneto-electronic devices that use such MTJs, such as for example, temperature sensitivity, operating speed and error rate. Further, MTJ materials tend to have higher sensitivities to elevated temperatures than the materials used in some semiconductor processes, the same processes often used to fabricate integrated circuits containing MTJs. In particular, SAF materials have a failure mode at elevated temperatures that can cause a degradation of the antiferromagnetic coupling strength. Thus, there is an ongoing need for MRAMs and other devices based on MTJs that have improved magnetoresistance ratios (MRs) that can lead to improved operating speed, read error rate, and temperature sensitivity of device, and at least the same or better switching characteristics, such as narrow switching distributions.

Accordingly, it is desirable to provide improved MRAMs and other devices employing an improved MTJ structure and method. In addition, it is desirable that the MTJ structure and method be simple, rugged and reliable, and further, be compatible with semiconductor device and integrated circuit structures and fabrication methods, and preferably but not essentially adapted to be formed on the same substrate. It is further desirable that the improved MTJ structure and method provide improved magnetoresistance ratios (MRs) and at least equal or improved other properties, as for example but not limited to temperature sensitivity, switching distribution, error rate, disturbs, etc. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

Figure 1:
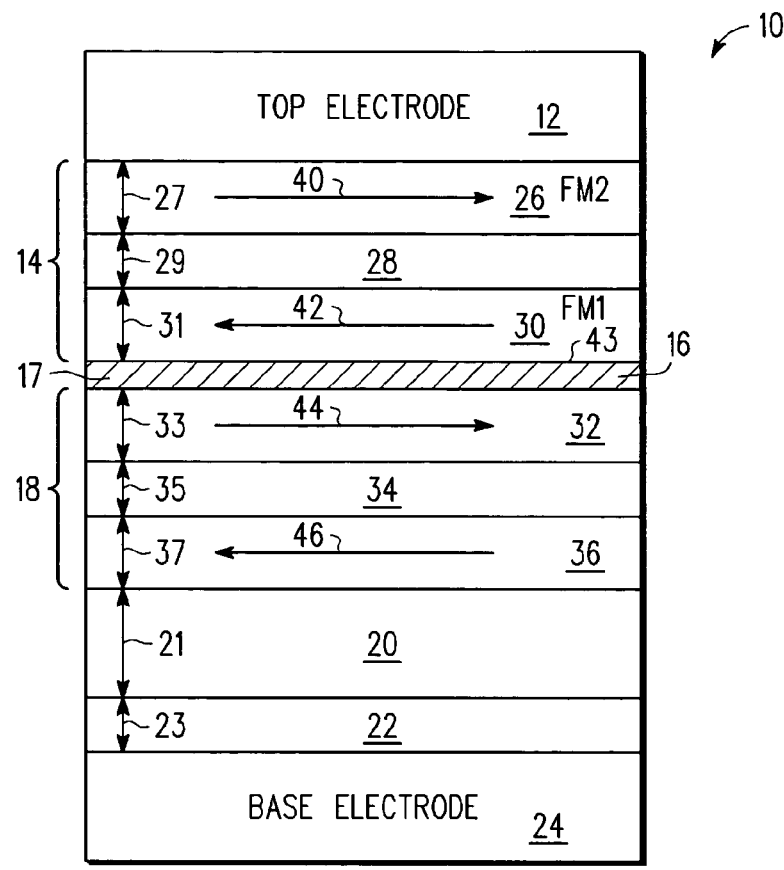
FIG. 1 is a simplified schematic cross-sectional view of a magnetic tunnel junction (MTJ) for use in magnetoresistive random access memories (MRAMs) and other devices, according to an embodiment of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or nonelectrical manner.

This invention concerns the use of various material compositions in the structure and fabrication of magnetic tunnel junctions (MTJs) for use in MRAMs and other devices (e.g., read heads, sensors, etc.). In order to facilitate understanding, the dielectric layer employed as the tunneling insulator in the MTJ is hatched. This is intended to make it more easily visible in relation to other device layers or regions and is not intended to be limiting. Nothing herein is intended to imply that the tunneling dielectric and/or the ferromagnetic or SAF layers described herein are limited merely to the positions shown in the various embodiments. These layers are typically formed by ion beam deposition (IBD) and/or physical vapor deposition (PVD). Other well known thin film fabrication techniques such as MBE, evaporation, etc, can also be used.

FIG. 1 is a simplified schematic cross-sectional view of magnetic tunnel junction (MTJ) 10 for use in magnetoresistive random access memories CRAMs) and other devices, according to an embodiment of the invention. MTJ 10 comprising top electrode 12, free SAF 14 immediately under top electrode 12, dielectric tunnel barrier 16 of thickness 17 immediately under SAF 14, and fixed SAF 18 immediately under tunnel barrier 16. Pinning layer 20 of thickness 21 is desirably but not essentially provided immediately under fixed SAF 18 and seed layer 22 of thickness 23 is desirably but not essentially provided immediately under layer 20. Base electrode 24 is conveniently provided immediately under seed layer 22 so that, in conjunctions with top electrode 12, MTJ 10 can be coupled to other devices or connections to form an MRAM or other electronic device structure. Ta, TaN, Al and Cu are non-limiting examples of materials useful for top electrode 12 and base electrode 24. The thicknesses of top and base electrodes 12, 24 are not critical as long as they do not add significant series resistance.

Free SAF 14 comprises ferromagnetic (FM) layer 26 of thickness 27, also referred to as FM2, located under top electrode 12. Non-magnetic coupling layer 28 of thickness 29 is located under ferromagnetic FM2 layer 26, and ferromagnetic layer 30 of thickness 31, also referred to as FM 1, is located under coupling layer 28. Fixed SAF 18 comprises ferromagnetic layer 32 of thickness 33 located under tunnel barrier 16, non-magnetic coupling layer 34 of thickness 35 located under ferromagnetic layer 32, and ferromagnetic layer 36 of thickness 37 located under coupling layer 34. Ferromagnetic layers 32 and 36 are preferably comprised of alloys that include cobalt and iron (CoFe) but other ferromagnetic material combinations may also be used. Thicknesses 33 and 37 are usefully in the range of about 10-50 Angstrom Units, with thicknesses in the range of about 15-35 Angstrom Units being convenient, but larger and smaller thicknesses can also be used. Coupling layer 28 of thicknesses 29 and coupling layer 34 of thickness 35 usefully comprises a combination of materials, such as for example and not intended to be limiting, ruthenium, osmium, iridium, rhodium, platinum, tantalum, chromium and/or combinations thereof. Ruthenium is preferred. Thicknesses 29 and 35 are usefully in the range of about 5-50 Angstrom units, more conveniently about 5-25 Angstrom units and preferably about 7-13 Angstrom units, although thicker and thinner layers may also be used. The purpose of coupling layers 28 and 34 is to keep magnetization vectors 40, 42 and 44, 46 separated by coupling layers 28, 34 respectively, in an anti-parallel arrangement (e.g., 40 anti-parallel to 42 and 44 anti-parallel to 46), so as to provide SAF structures 14, 18, respectively. Magnetization vector 42 together with magnetization vector 40 is flipped or rotated with respect to magnetization vector 44 as MTJ 10 is subjected to an external magnetic field (not shown). Such operation is conventional.

Ferromagnetic layer 26 (FM2) of thickness 27 and ferromagnetic layer 30 (FM1) of thickness 31 preferably include nickel and iron but, as will be further explained, with different relative Ni:Fe concentrations. Other materials may also be used. Assuming that NiFe is used, thicknesses 27, 31 are usefully in the range of about 10-100 Angstrom Units, conveniently about 20-80 Angstrom Units and preferably about 30-60 Angstrom Units. Other materials and other thicknesses may also be used provided that the proper relative magnetic properties described below are obtained. NiFeCo, CoFeB, NiFeX (X=Ta, Mo, Cr, etc.) and combinations thereof are non-limiting examples of other ferromagnetic materials useful for layers 26 and/or 30. Pinning layer 20 of thickness 21 is conveniently of MnPt and optional seed layer 22 of thickness 23 is conveniently of Ru, Ta, TaN, or NiFe. Thickness 21 is typically about in the range of 100 to 250 Angstrom Units and thickness 23 is typically in the range of about 10 to 100 Angstrom Units, but thinner or thicker layers can also be used It is known to those skilled in the art that the fixed SAF 18 can be replaced by other structures that provide a magnetically fixed layer 32 in contact with the tunnel barrier 16, e. g., a single pinned ferromagnetic layer, such that magnetization vector 44 of fixed layer 32 does not move substantially in the applied magnetic fields used to switch or otherwise change the magnetization direction of free layer 14.

Figure 2:
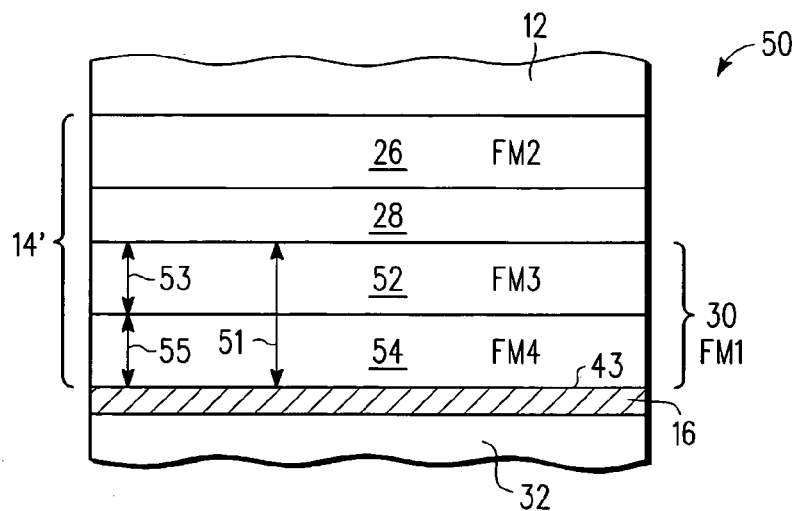
FIG. 2 is a simplified schematic cross-sectional view of a portion of the magnetic tunnel junction (MTJ) of FIG. 1, but according to a further embodiment of the invention.

FIG. 2 is a simplified schematic cross-sectional view of MTJ 50 comprising SAF 14' analogous to SAF 14 of magnetic tunnel junction (MTJ) 10 of FIG. 1, but according to a further embodiment of the invention. SAF 14' of FIG. 2 differs from SAF 14 of FIG. 1 in that lower FM free layer 30 (FM1) comprises two FM layers 52 and 54, also referred to respectively as FM3 and FM4. FM layers 52, 54 (FM3, FM4) desirably comprise NiFe (but of different relative compositions) or other alloys (such as CoFe, CoFeB) with combined thickness 51 about comparable to thickness 31 of layer 30. Thickness 53 of layer 52 (FM3) is usefully in the range of about 50 to 95 percent of thickness 51, more conveniently about 70 to 95 percent and preferably about 80 to 95 percent, with the balance comprising thickness 55.

It has been found that the properties of MTJs 10 and 50 are improved by selecting the magnetic properties of layers 26 (FM2) and 30 (FM1) differently. This is preferably accomplished by selection of the materials and/or relative composition (or both) of the two layers. For example, in order to obtain a large magnetoresistance ratio (MR) it is desirable that layer 30 (FM1) adjacent dielectric tunnel barrier 16 have high spin polarization. Unfortunately this is generally accompanied by large magnetostriction. Magnetostriction is the property of magnetic materials wherein their dimensions change in response to an applied magnetic field and vice versa. In general, most of the ferromagnetic materials with large spin polarization have large magnetostriction, which is a great disadvantage for use as the free layer in any magneto-electronic devices. The magnetostriction can be positive or negative. If positive, the material expands in the presence of a magnetic field and if negative the material contracts in the presence of a magnetic field.

Figure 3:
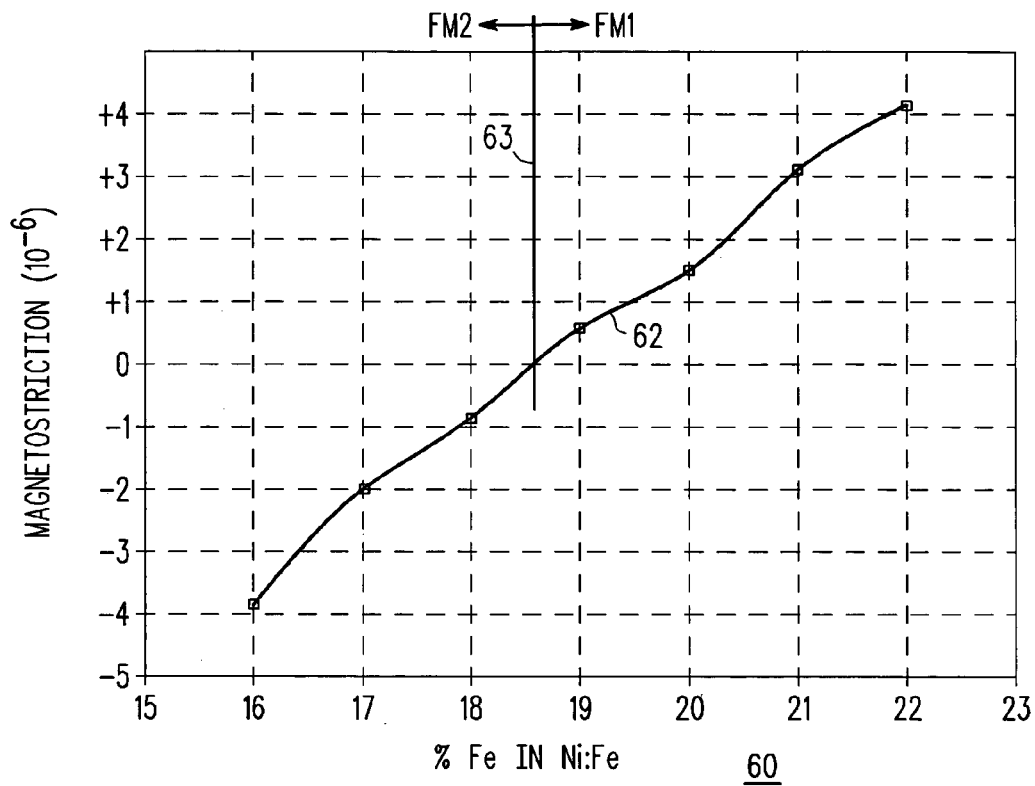
FIG. 3 shows a simplified plot of the magnetostriction exhibited by a structure employing NiFe/Ru/NiFe layers as a function of the percent Fe in the NiFe layers.

FIG. 3 shows simplified plot 60 of graph 62 of the magnetostriction exhibited by a structure employing NiFe/Ru/NiFe layers, as a function of the atomic percent Fe in the NiFe layer. It can be seen that at low relative Fe concentrations (e.g., ≦about 18-19 atomic percent Fe in NiFe), the magnetostriction is negative and becomes more negative as less Fe is included in the NiFe layer. Conversely, as the Fe content increases, so does the magnetostriction (MS). For Fe concentrations above about 18-19 atomic percent Fe in the NiFe layer, the magnetostriction is positive. Line 63 indicates the approximate dividing point of relative Fe concentration between negative and positive magnetostriction behavior. As will be subsequently explained, it is desirable to choose relative Fe concentrations in FM1 approximately to the right of line 63 and relative concentrations of FM2 approximately to the left of line 63, although slightly higher or lower values may be desirable depending upon the particular materials and process being used. It was found for example, the having a slightly positive (e.g., about 0.5E-6) net magnetostriction gave the best results.

Figure 4:
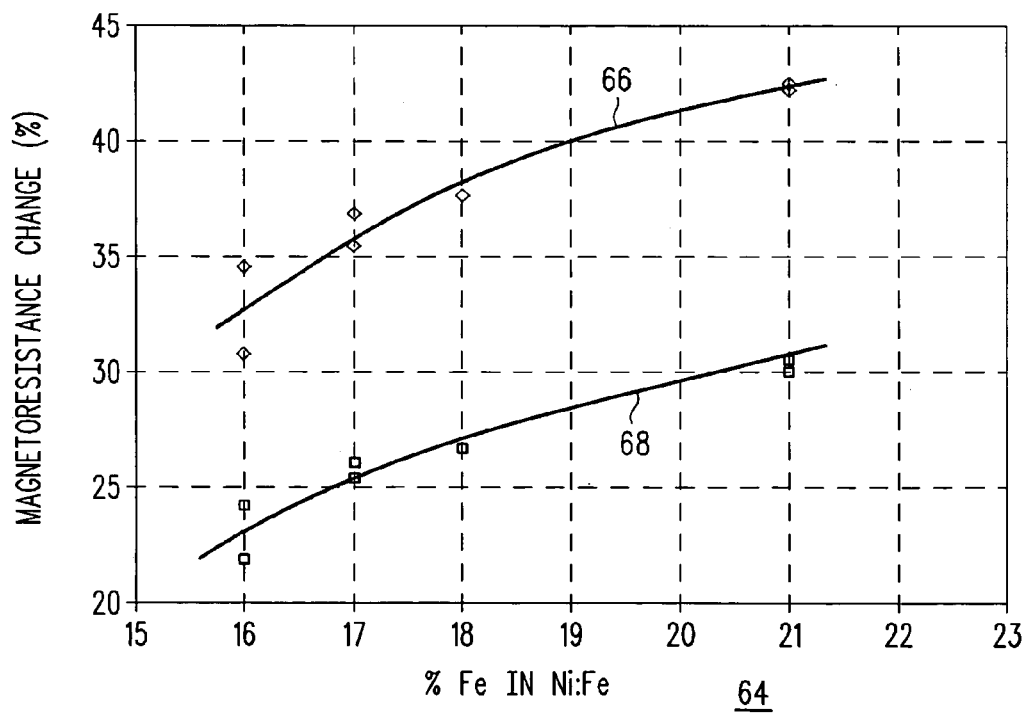
FIG. 4 shows a simplified plot of the magnetoresistance ratio, that is the percent change in the magnetoresistance of a MTJ of the type illustrated in FIGS. 1, as a function of the percent Fe in NiFe SAF free layers.

FIG. 4 shows simplified plot 64 of graphs 66, 68 of the magnetoresistance ratio (MR), that is, the percent change in the magnetoresistance of a MTJ of the type illustrated in FIGS. 1-2, as a function of the percent Fe in NiFe free layers 26, 30. Graph 66 corresponds to the MR measured near zero volts bias across the MTJ and graph 68 corresponds to the MR obtained at about −300 millivolts bias across the MTJ. It will be noted that as the atomic percent Fe in the NiFe layers increases, the MR also increases. This is believed to be as a consequence of the increase of the spin polarization associated with the higher Fe concentration in the NiFe layers. Unfortunately, the accompanying increase in magnetostriction predicted from FIG. 3 causes the overall switching properties and the temperature dependence of the MTJ to degrade with an increase in the Fe content. Thus, while the MR can be increased (e.g., see FIG. 4) by increasing the Fe content of for example, layer 30, its usefulness for MTJs is degraded because of the adverse effect (see FIG. 3) of the increase in magnetostriction (MS) that accompanies the increase in MR.

It has been found that by using different relative Fe content in ferromagnetic NiFe layer 26 (FM2) and layer 30 (FM1) that a significant increase in MR can be obtained without the adverse effects on other MTJ properties (e.g., switching, operating temperature dependencies, switching current distributions, etc.) that ordinarily accompany an increase in the spin polarization due to magnetostriction effects. This is accomplished by providing a higher relative Fe content in NiFe layer 30 and a lower relative Fe content in NiFe layer 26. For example, and not intended to be limiting, it is useful that layer 30 (FM1) have a Fe content above about the zero magnetostriction point and that layer 26 (FM2) have a Fe content below about the zero magnetostriction point. For example, as shown in FIG. 3 for NiFe layers, zero magnetostriction (MS) occurs at about 18-19 atomic percent Fe in the NiFe layer. With other material combinations, zero magnetostriction may occur at other composition ratios. Stated another way that applies more generally than just to NiFe layers, it is desirable that layer 30 (FM1) have magnetostriction (MS) of a first sign, e.g., positive, and layer 26 (FM2) have a magnetostriction (MS) of opposite sign, e.g., negative, or vice versa At the same time, the material of layer 30 should be chosen to maximize the MR, generally by choosing materials that exhibit higher spin polarization.

FIG. 4 shows that the MR can be increased by, for example, further increasing the Fe concentration in NiFe layer 30. For example, the MR at 21 atomic percent Fe in NiFe layer 30 is about 2-6% higher than at 18-19 atomic percent Fe in NiFe layer 30. However, the large magnetostriction effect remains unless balanced out by correspondingly adjustment of the Fe concentration in layer 26. What is desirable using NiFe layers is that the increase in positive magnetostriction (MS) resulting from the higher Fe concentration in layer 30 (FM1) be balanced by the negative magnetostriction (MS) resulting from lower Fe concentration in layer 26 (FM2) so that SAF 14 has substantially zero magnetostriction (i.e., the large positive magnetostriction in layer 30 being balanced by a correspondingly large magnitude of negative magnetostriction in layer 26 acting through coupling layer 28). As noted previously, it was found that the best results were obtained for NiFe SAF 14 with a slight net positive measured magnetostriction of about 0.5E-6 rather than exactly zero magnetostriction, but this is not believed to depart substantially from the general principal of balancing the magnetostriction provided by the combination layers 26, 28, 30 to within about +/−1E-6 of zero, preferably about +/−0.5E-6 of zero, which ranges are intended to be included in the term "substantially zero magnetostriction."

It is important that the higher spin polarization material be located in layer 30 adjacent dielectric tunnel barrier 16, since the MR depends upon the spin polarization of the material into which the tunneling occurs. Thus, the compensating magnetostriction material (e.g., the negative MS NiFe material) is desirably located in layer 26. SAF 14 formed by layers 26, 28, 30 tends to act as a single magnetic entity, so a large (e.g., positive) magnetostriction in layer 30 can be compensated by an e.g., negative magnetostriction in layer 26 While the foregoing has been illustrated by the use of positive magnetostriction material in layer 30 and negative magnetostriction material in layer 26, this is not essential. Stated more generally, layer 30 (FM1) should be of a material that exhibits high spin polarization and layer 26 (FM2) should be of a material whose magnetostriction is adjusted to compensate the magnetostriction of layer 30, whether positive or negative, across coupling layer 28. Accordingly, while NiFe alloys are a preferred material for layers 26, 30, other materials can also be used, such as NiFeCo, CoFeB and so on. It is important that such materials be able to provide, a first composition in layer 30, or more particularly in the portion of layer 30 proximate to interface 43 of layer 30 with dielectric tunnel barrier 16, having a higher spin polarization, and a second composition located, for example, in layer 26 across coupling layer 28 from the material of layer 30, whose properties can be adjusted to compensate (e.g., balance out) the magnetostriction of the material of the first composition.

Figure 5:
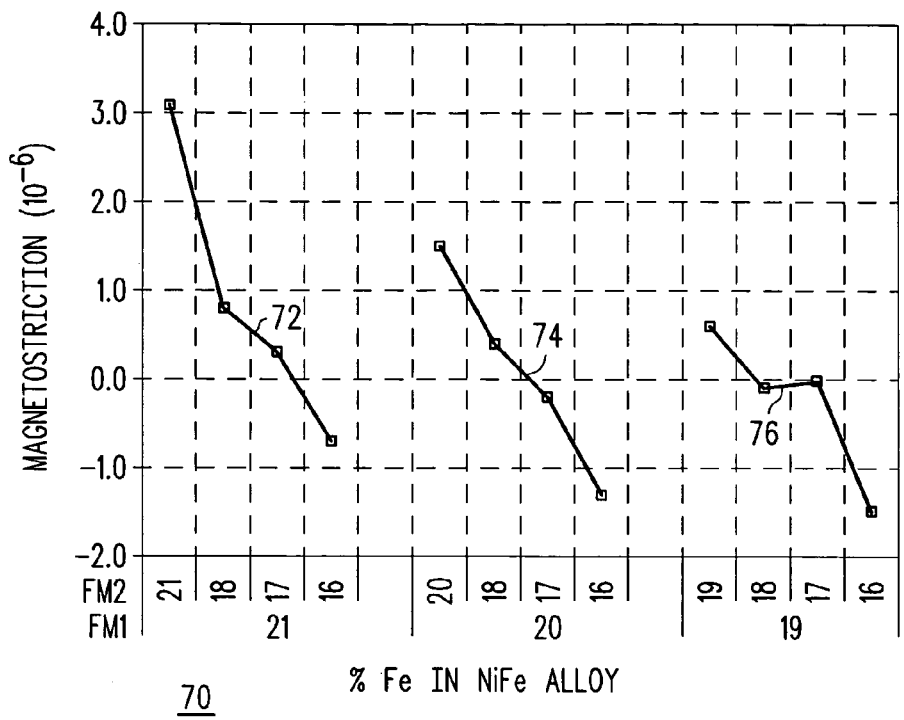
FIG. 5 shows a simplified plot of the magnetostriction exhibited by the NiFe/Ru/NiFe free layer of the MTJ as a function of the percent Fe in the FM1 and FM2 portions of the NiFe free layer of the MTJ of FIG. 1, for three different percentage of Fe in the FM1 portion of the free layer.

FIG. 5 shows simplified plot 70 of the magnetostriction exhibited by a NiFe SAF free layer of MTJ 10 as a function of the percent Fe in FM1 and FM2. Graphs 72, 74, 76 illustrate how the magnetostriction of SAF fee layer 14 changes as the Fe content (in atomic percent) of FM2 changes, for FM1 layer Fe concentrations of 21, 20 and 19 atomic percent, respectively,of Fe in FM1. Considering graph 72 where FM1 has an iron content of about 21 atomic percent Fe, if FM2 also has an Fe content of about 21 atomic percent, then the magnetostriction value of the combination (e.g., for SAF 14) is large and positive. Although a large MR value may be obtained, it will likely be accompanied by degradation of other MTJ properties (such as switching characteristics) associated with the large net magnetostriction, which degradation is undesirable. By choosing appropriate Fe content percentages for FM2, the net magnetostriction of SAF 14 can be reduced to near zero, i.e., substantially zero magnetostriction, even for a high value of Fe content (and therefore large spin polarization and higher MR values) in FM1. Graphs 74, 76 illustrate corresponding values of magnetostriction for other Fe concentrations in FM1 as a function of the relative Fe concentration in FM2. Thus, read together, FIGS. 1-5 illustrate an important aspect of the invention that the MR ratio of the MTJ can be improved without sacrifice of other properties of the MTJ, by providing a first high spin polarization material next to the dielectric tunnel barrier and a second magnetostriction compensating material spaced apart from the dielectric tunneling barrier but magnetically coupled to the first material. Other high spin polarization materials can be used as first free FM layer or region 30, as for example, CoFeB and NiFeCo as well as NiFe.

Referring again to FIGS. 1 and 2, FIG. 1 illustrates the situation where high spin polarization layer 30 and magnetostriction compensating layer 26 are separated by coupling layer 28, but this is not essential. While it is important that high spin polarization be provided proximate interface 43 with dielectric tunnel barrier 16, it is not necessary that magnetostriction compensation be relegated entirely to layer 26 on the other side of coupling layer 28. FIG. 2 illustrates a further embodiment of the invention, wherein layer 30 (FM1) is divided into two portions, with high spin polarization portion 54 (FM4) adjacent or proximate interface 43 and lower spin polarization portion 52 (FM3) located between portion 54 and coupling layer 28. Portion 52 may have the same or different composition than layer 26, and the combination of layer 26 and portion 52 are used as magnetostriction compensation layers to offset the magnetostriction provided by high spin polarization portion 54. This provides additional degrees of freedom in fabricating SAF 14 so as to have the combination of high MR and low net magnetostriction, so that the increase in MR is not accompanied by degradation of other properties of MTJs 10, 50 and the MRAM or other devices using such MTJs.

Figure 6:
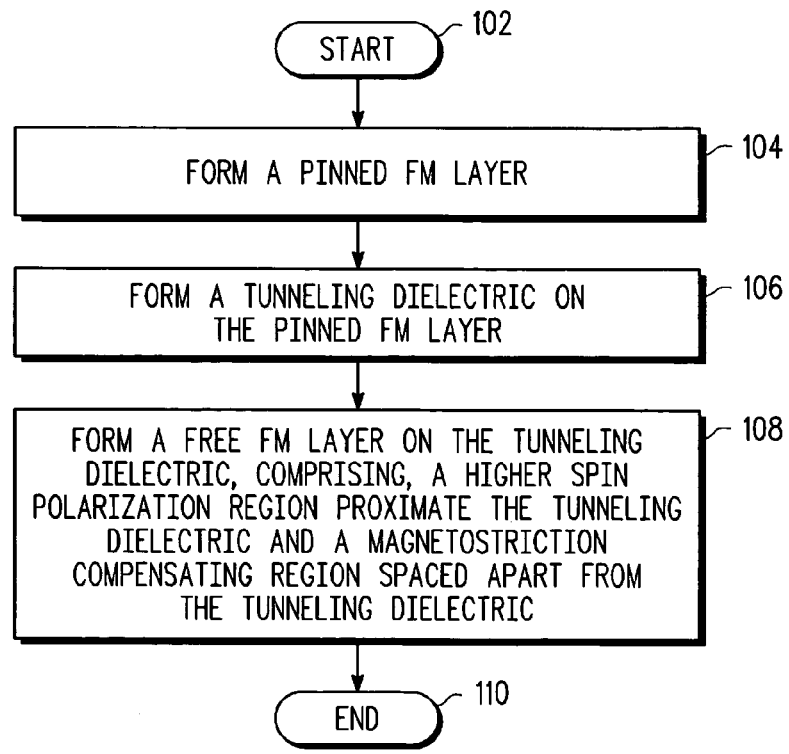
FIG. 6 is a simplified schematic flow charts of a method for forming a MTJ of the type illustrated in FIGS. 1 and 2, according to still further embodiment of the invention.

FIG. 6 is a simplified schematic flow chart of method 100 for forming a MTJ of the type illustrated in FIGS. 1-2, according to still further embodiments of the invention. The discussion of the methods of formation, composition, thickness and other properties of the various layers illustrated or referred to in connection with FIGS. 1-5 is incorporated herein by reference. Method 100 begins with START 102 and initial step 104 wherein a pinned ferromagnetic (FM) layer such as layer 18 and/or 32 is formed, using means well known in the art. In subsequent step 106 a thin dielectric tunneling barrier (e.g., barrier 16), of for example and not intended to be limiting aluminum oxide, is formed on the pinned FM layer. Persons of skill in the art will understand how to form such a tunneling dielectric and adjust its thickness in accordance with the desired electrical resistance of their MTJs. In step 108, a free FM layer is formed on the tunneling dielectric, wherein the free FM layer has at least two components, a first higher spin polarization layer or region (as for example and not intended to be limiting, NiFe with more than about 18.6 atomic percent Fe) proximate the tunneling dielectric and a second lower spin polarization but magnetostriction compensation layer or region (as for example and not intended to be limiting, NiFe with less than about 18.6 atomic percent Fe) spaced apart from the tunneling dielectric. Method 100 then proceeds to END 110.

Figure 7:
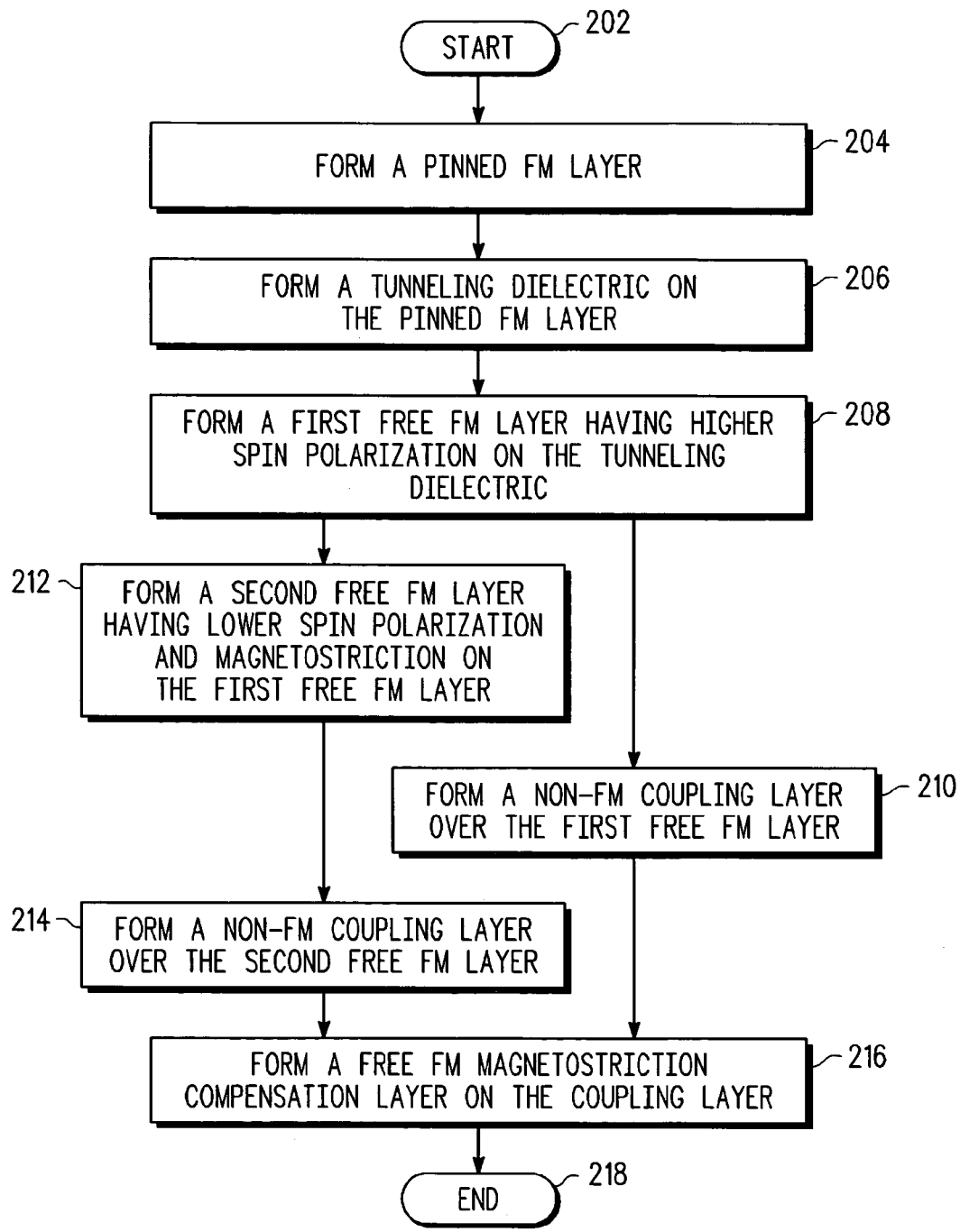
FIG. 7 is a simplified schematic flow charts of a method for forming a MTJ of the type illustrated in FIGS. 1 and 2, according to yet further embodiment of the invention and showing further details.

FIG. 7 is a simplified schematic flow diagram of method 200 for forming a MTJ of the type illustrated in FIGS. 1-2, according to yet further embodiments of the invention and providing further details. Method 200 begins with START 202 and initial steps 204, 206 analogous to steps 104, 106 of method 100, the discussion of which is incorporated herein by reference. In step 208 there is formed a free ferromagnetic (FM) layer, e.g., layer 30, 54, having higher spin polarization on the tunneling dielectric layer. Following step 208, method 200 divides according to other embodiments. Method 200 may proceed along path 210, 216 to END 218 or along path 212, 214, 216 to end 218. Considering path 210, 216, method 200 proceeds from step 208 to step 210 wherein there is formed a nonferromagnetic coupling layer (e.g. layer 28) over the first free ferromagnetic (FM) layer (e.g., layer 30, 54). Following step 210, method 200 proceeds to step 216 wherein there is formed a further free ferromagnetic (FM) layer (e.g., layer 26) on the coupling layer (e.g., layer 28) adapted to compensate for the magnetostriction of the first free FM layer. Considering path 212, 214, 216, 218, following step 208, method 200 proceeds to step 212 wherein a second free ferromagnetic (FM) layer having lower spin polarization and partially compensating magnetostriction (e.g., layer 52) is formed on the first free FM layer (e.g., layer 54). In subsequent step 214, a non-ferromagnetic coupling layer (e.g., layer 28) is formed over the second free FM layer (e.g., layer 52) and in step 216, a further free ferromagnetic (FM) layer (e.g., layer 26) adapted to compensate for the magnetostriction of the first and second free FM layers is formed on the coupling layer. Following step 216, method 200 proceeds to END 218.

According to a first embodiment, there is provided a magnetic tunnel junction (MTJ), comprising, a pinned ferromagnetic (FM) layer, a tunneling dielectric layer on the pinned FM layer, a first free FM layer having higher first spin polarization and a first magnetostriction, on the tunneling dielectric, a non-FM coupling layer over the first free FM layer, and a second free FM layer spaced apart from the first free FM layer at least by the coupling layer, and having a lower second spin polarization and a second magnetostriction different than the first magnetostriction and adapted to compensate the first magnetostriction so that a ret magnetostriction of the first and second free FM layers has a magnitude less than the magnitude of first magnetostriction. According to a further embodiment, at least one of the first and second free FM layers comprise Ni and Fe and the coupling layer comprises ruthenium, osmium, niobium, iridium, rhodium, platinum, tantalum, chromium or combinations thereof. According to a still further embodiment, the first and second free FM layers comprise NiFe alloys wherein the Fe concentration in the first free FM layer is higher than the Fe concentration in the second free FM layer. According to a yet further embodiment, the Fe concentration in the first free FM layer exceeds about 18-19 atomic percent Fe. According to a still yet further embodiment, the first free FM layer comprises one of alloys from a group of NiFe, CoFeB and NiFeCo.

According to a second embodiment, there is provided a magnetic tunnel junction (MTJ), comprising, a pinned ferromagnetic (FM) layer, a free synthetic antiferromagnet (SAF) layer, a. tunneling dielectric separating the pinned FM layer and the free SAF layer, wherein, the free SAF layer comprises, a first free FM layer proximate the tunneling dielectric and having a higher first spin polarization and having a first magnetostriction, and a second free FM layer spaced apart from the tunneling dielectric and having a lower second spin polarization and a second magnetostriction different than the first magnetostriction and adapted to compensate the first magnetostriction so that a net magnetostriction has a magnitude less than the magnitude of the first magnetostriction. According to a further embodiment, the magnitude of the net magnetostriction is less than about 1.0E-6. According to a still further embodiment, the magnitude of the net magnetostriction is less than about 0.5E-6. According to a yet further embodiment, the MTJ further comprises, a non-ferromagnetic coupling layer located between the first and second free FM layers, wherein the first free FM layer comprises two portions, a first portion of higher first spin polarization and first magnetostriction proximate the tunneling dielectric and a second portion of lower spin polarization proximate the coupling layer. According to a still yet further embodiment, the first portion of higher first spin polarization and first magnetostriction proximate the tunneling dielectric comprises one of alloys from a group comprising CoFe, CoFeB and NiFeCo. According to a yet still further embodiment, the first and second free FM layers comprise NiFe, wherein the Fe concentration in the first free FM layer is equal or greater than about 18-19 atomic percent Fe and wherein the Fe concentration in the second free FM layer is less than the Fe concentration in the first free FM layer.

According to a third embodiment, there is provided a method for forming a magnetic tunnel junction (MTJ), comprising, forming a pinned ferromagnetic layer, providing a tunneling dielectric on the pinned ferromagnetic layer, forming a free ferromagnetic layer on the tunneling dielectric, having at least two regions, a first region of higher first spin polarization and first magnetostriction proximate the tunneling dielectric, and a second region spaced apart from the tunneling dielectric by at least the first region and having a lower second spin polarization and a second compensating magnetostriction so that the combination of the first and second regions provides a magnitude of a net magnetostriction less than the magnitude of the first magnetostriction of the first region. According to a further embodiment, the magnitude of the net magnetostriction of the combination is less than about 1.0E-6. According to a still further embodiment, the magnitude of the net magnetostriction of the combination is less than about 0.5E-6. According to a yet further embodiment, the method further comprises forming a non-ferromagnetic coupling layer lying between the first and second regions. According to a still yet further embodiment, the first region comprises two portions, a first portion of higher first spin polarization and first magnetostriction proximate the tunneling dielectric and a second portion of lower spin polarization proximate the non-ferromagnetic coupling layer. According to a yet still further embodiment, the first and second regions comprise NiFe, wherein the Fe concentration in the first region is equal or greater than about 18-19 atomic percent Fe and wherein the Fe concentration in the second region is less than the Fe concentration in the first region. According to an additional embodiment, the second free ferromagnetic region has a spin polarization less than the first free ferromagnetic region. According to a still additional embodiment, magnetostriction of the first region is positive and the magnetostriction of the second region is negative. According to a yet additional embodiment, the net magnetostriction is approximately zero.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A magnetic tunnel junction (MTJ), comprising:
   a pinned ferromagnetic (FM) layer;
   a tunneling dielectric layer on the pinned FM layer;
   a first free FM layer having higher first spin polarization and a first magnetostriction, on the tunneling dielectric;
   a non-FM coupling layer over the first free FM layer; and
   a second free FM layer spaced apart from the first free FM layer at least by the coupling layer, and having a lower second spin polarization and a second magnetostriction different than the first magnetostriction and adapted to compensate the first magnetostriction so that a net magnetostriction of the first and second free FM layers has a magnitude less than the magnitude of first magnetostriction.

2. The MTJ of claim 1, wherein at least one of the first and second free FM layers comprise Ni and Fe and the coupling layer comprises ruthenium, osmium, niobium, iridium, rhodium, platinum, tantalum, chromium or combinations thereof.

3. The MTJ of claim 1, wherein the first and second free FM layers comprise NiFe alloys wherein the Fe concentration in the first free FM layer is higher than the Fe concentration in the second free FM layer.

4. The MTJ of claim 3, wherein the Fe concentration in the first free FM layer exceeds about 18-19 atomic percent Fe.

5. The MTJ of claim 1, wherein the first free FM layer comprises one of alloys from a group of NiFe, CoFeB and NiFeCo.

6. A magnetic tunnel junction (MTJ), comprising:
   a pinned ferromagnetic (FM) layer;
   a free synthetic antiferromagnet (SAF) layer;
   a tunneling dielectric separating the pinned FM layer and the free SAF layer;
   wherein, the free SAF layer comprises:
      a first free FM layer proximate the tunneling dielectric and having a higher first spin polarization and having a first magnetostriction; and
      a second free FM layer spaced apart from the tunneling dielectric and having a lower second spin polarization and a second magnetostriction different than the first magnetostriction and adapted to compensate the first magnetostriction so that a net magnetostriction has a magnitude less than the magnitude of the first magnetostriction.

7. The MTJ of claim 6, wherein the magnitude of the net magnetostriction is less than about 1.0E-6.

8. The MTJ of claim 7, wherein the magnitude of the net-magnetostriction is less than about 0.5E-6.

9. The MTJ of claim 6, further comprising a non-ferromagnetic coupling layer located between the first and second free FM layers, wherein the first free FM layer comprises two portions, a first portion of higher first spin polarization and first magnetostriction proximate the tunneling dielectric and a second portion of lower spin polarization proximate the coupling layer.

10. The MTJ of claim 6, wherein the first portion of higher first spin polarization and first magnetostriction proximate the tunneling dielectric comprises one of alloys from a group comprising CoFe, CoFeB and NiFeCo.

11. The MTJ of claim 6, wherein the first and second free FM layers comprise NiFe, wherein the Fe concentration in the first free FM layer is equal or greater than about 18-19 atomic percent Fe and wherein the Fe concentration in the second free FM layer is less than the Fe concentration in the first free FM layer.

12. A method for forming a magnetic tunnel junction (MTJ), comprising:

forming a pinned ferromagnetic layer;

providing a tunneling dielectric on the pinned ferromagnetic layer;

forming a free ferromagnetic layer on the tunneling dielectric, having at least two regions, a first region of higher first spin polarization and first magnetostriction proximate the tunneling dielectric, and a second region spaced apart from the tunneling dielectric by at least the first region and having a lower second spin polarization and a second compensating magnetostriction so that the combination of the first and second regions provides a magnitude of a net magnetostriction less than the magnitude of the first magnetostriction of the first region.

13. The method of claim 12, wherein the magnitude of the net magnetostriction of the combination is less than about 1.0E-6.

14. The method of claim 13, wherein the magnitude of the net magnetostriction of the combination is less than about 0.5E-6.

15. The method of claim 12, further comprising forming a non-ferromagnetic coupling layer lying between the first and second regions.

16. The method of claim 15, wherein the first region comprises two portions, a first portion of higher first spin polarization and first magnetostriction proximate the tunneling dielectric and a second portion of lower spin polarization proximate the non-ferromagnetic coupling layer.

17. The method of claim 12, wherein the first and second regions comprise NiFe, wherein the Fe concentration in the first region is equal or greater than about 18-19 atomic percent Fe and wherein the Fe concentration in the second region is less than the Fe concentration in the first region.

18. The method of claim 12, wherein the second free ferromagnetic region has a spin polarization less than the first free ferromagnetic region.

19. The method of claim 12, wherein magnetostriction of the first region is positive and the magnetostriction of the second region is negative.

20. The method of claim 12, wherein the net magnetostriction is approximately zero.

* * * * *